US011189985B2

(12) United States Patent
Allouche et al.

(10) Patent No.: US 11,189,985 B2
(45) Date of Patent: Nov. 30, 2021

(54) OPTOELECTRONIC ASSEMBLY

(71) Applicant: II-VI Delaware, Inc, Wilmington, DE (US)

(72) Inventors: David Allouche, Belmont, CA (US);
Michael Chu, Sunnyvale, CA (US);
Brian R. Carey, Sunnyvale, CA (US);
Jonathan Ashbrook, Homer, IL (US);
Anita Chan, Sunnyvale, CA (US);
Krzysztof Szczerba, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 11 days.

(21) Appl. No.: 16/706,638

(22) Filed: Dec. 6, 2019

(65) Prior Publication Data
US 2020/0185875 A1    Jun. 11, 2020

Related U.S. Application Data

(60) Provisional application No. 62/776,440, filed on Dec. 6, 2018.

(51) Int. Cl.
*H01S 3/13*       (2006.01)
*G11B 7/006*     (2006.01)
*G11B 7/126*     (2012.01)
*G11B 7/00*       (2006.01)

(52) U.S. Cl.
CPC .......... *H01S 3/1305* (2013.01); *G11B 7/0062* (2013.01); *G11B 7/126* (2013.01); *G11B 2007/0006* (2013.01)

(58) Field of Classification Search
None
See application file for complete search history.

(56) References Cited

U.S. PATENT DOCUMENTS

| 2003/0035460 | A1* | 2/2003 | Tsikos | G06K 7/10 372/101 |
| 2003/0194168 | A1* | 10/2003 | Ouchi | G11B 7/123 385/14 |
| 2010/0151614 | A1* | 6/2010 | Darbinyan | G02B 6/4214 438/65 |
| 2012/0001166 | A1* | 1/2012 | Doany | H01L 27/04 257/43 |
| 2013/0315528 | A1* | 11/2013 | Levy | G02B 6/425 385/14 |
| 2013/0334445 | A1* | 12/2013 | Tharumalingam | H01L 25/165 250/552 |

(Continued)

FOREIGN PATENT DOCUMENTS

EP          3125008 A1      2/2017

OTHER PUBLICATIONS

International Search Report and Written Opinion dated Mar. 24, 2020, in related PCT Application No. PCT/US2019/065105.

*Primary Examiner* — Tan X Dinh
(74) *Attorney, Agent, or Firm* — Blank Rome LLP

(57) ABSTRACT

An optoelectronic assembly is disclosed. The disclosed assembly includes one or more lasers formed on a first substrate, and a programmable driver circuit formed on a second substrate configured as an integrated circuit. The first and second substrates are mounted on a third substrate in a stacked arrangement.

17 Claims, 7 Drawing Sheets

(56) References Cited

U.S. PATENT DOCUMENTS

| | | | |
|---|---|---|---|
| 2015/0098677 A1* | 4/2015 | Thacker | G02B 6/428 |
| | | | 385/14 |
| 2015/0380897 A1 | 12/2015 | Canumalla et al. | |
| 2017/0031115 A1* | 2/2017 | Schaevitz | H01S 5/02251 |
| 2018/0278011 A1* | 9/2018 | Galvano | H01S 5/0231 |
| 2018/0299628 A1* | 10/2018 | Liu | H01L 23/49822 |
| 2018/0335588 A1* | 11/2018 | Jou | G02B 6/1221 |
| 2020/0127156 A1* | 4/2020 | Camarri | H01L 25/167 |

\* cited by examiner

Pulse Parameters (Electrical Drive Current)

Direct Drive Example, Ivcsel Is Responsive To Input

Triggered Example, Pulses Start Due To Chosen Trigger Signal

Pulse Pattern Generator vs. uController Generated Timing

PWH, PWL are faster than SysCLK and independent of SysCLK

OPTOELECTRONIC ASSEMBLY

CROSS-REFERENCE TO RELATED APPLICATIONS

This patent application claims the benefit of and priority to U.S. Provisional Application No. 62/776,440 filed on Dec. 6, 2018, which is each incorporated herein by reference in its entirety.

FIELD

The implementations discussed herein are related to optoelectronic assemblies, including optical emitter arrays and associated circuitry, that are configured in a manner to provide enhanced operating characteristics.

BACKGROUND

Unless otherwise indicated, the materials described herein are not prior art to the claims in the present application and are not admitted to be prior art by inclusion in this section.

An optical emitter (sometimes referred to as an electro-optic transducer, or laser) such as a Vertical Cavity Surface Emitting Laser (VCSEL) emits light when electrical current, sometimes referred to as "drive current," is passed through the device. The intensity of the emitted light is a function of the magnitude of the electrical drive current, and the duration of a pulse of emitted light is a function of the duration of the electrical drive current provided. Thus, a change in drive current equals a corresponding change in the optical emitter's output power (light intensity) and pulse width (duration). Typically, the circuit that provides drive current to the optical emitter is referred to as a laser driver, or simply a driver.

In a conventional implementation, a driver circuit may be implemented on the top surface of an integrated circuit (IC) chip that is in turn mounted on a printed circuit board (PCB), or similar substrate. Disposed on the same PCB and laterally adjacent to the driver circuit IC is the optical emitter, such as a VCSEL, which might typically be implemented as a "top-emitting" VCSEL. As is known, an electrical connection must be provided to the top of the VCSEL in order to provide the drive current. To do so, the laser driver circuit might be electrically connected to the VCSEL via one or more "wire bonds" (electrical connections). Such wire bond(s) extend from the bond pads formed on the top surface of the of the top-emitting VCSEL to trace(s) in the PCB, and additional wire bond(s) that extend to the circuit residing on the top surface of the driver IC to complete the electrical connection. The wire bonds, bond pads and the traces formed in the PCB collectively introduce parasitic elements, such as distributed capacitance and inductance into the completed circuit, which increase as the length of the electrical path increases. Interconnections of this sort can also increase cross-talk and electro-magnetic interference (EMI) within the circuit. Moreover, the wire bonds can be relatively long, including the wire bond loop height as it extends from the surface of a device, further exacerbating the issues associated with the foregoing. Such parasitic elements, cross-talk, and EMI can be problematic, especially at higher transmission rates, and ultimately can limit the speeds at which the laser driver can control the VCSEL (or similar optical transmitter), thereby limiting the frequency response of the VCSEL. For example, increased inductance results in increased rise and fall times of the laser pulses emitted by the VCSEL. As rise and fall times increase the optical-electrical (O/E) bandwidth and corresponding modulation bandwidth may be less than optimal, particularly for certain high-speed applications.

Such limitations can be particularly problematic for imaging applications. For example, applications such as 3D imaging, light detection and ranging (LIDAR), and Time of Flight (TOF) imaging all utilize laser(s) to cast light (e.g., structured light or unstructured light) onto an object and there is often a need for increased signal generation rates in the form of laser pulses. In a typical implementation, distance of an object is determined by measuring the traveling time of light emitted from a laser source (such as a VCSEL), reflected from the object, and finally received by a sensor, such as a photo-diode. So-called direct time-of-flight systems use short laser pulses and detectors to determine the traveling time directly. Indirect time-of-flight systems measure the phase shift between the emitted and the received pulse train. In such applications, precise and high frequency control of the laser by the laser driver is important for accurate and consistent measurements, and as the transmission rates increase, the characteristics of the laser operation in response to a signal from the laser driver to turn on or off become increasingly important. Parasitic elements, cross-talk, and EMI can all limit such laser operation and, as such, conventional implementations of the laser driver and optical emitter are often not conducive to these higher signal rates.

Wire bonding to connect a top-emitting VCSEL (or similar laser emitter) to other circuitry is problematic in other respects as well. For example, wire bonding increases the footprint of the laser package assembly. Also—in the context of a top-emitting VCSEL—since the active region (where the heat is being generated) is on the top side of the laser wafer, the heat source is farther away from the heatsink, which is typically located at the back of the wafer. This will significantly raise the junction temperature of the VCSEL as the heat is not removed quickly from the front side of the wafer. Furthermore, the numerous wire bonds required by existing designs introduce significant manufacturing complexity, greater potential for defects, and increased costs.

The subject matter described herein is not limited to implementations that solve any disadvantages or that operate only in environments such as those described above. Rather, this background is only provided to illustrate one example technology area where some implementations described herein may be practiced.

BRIEF DESCRIPTION OF THE DRAWINGS

To further clarify the above and other advantages and features of the present invention, a more particular description of example embodiments of the invention will be rendered by reference to specific implementations thereof which are illustrated in the appended drawings. It is appreciated that these drawings depict only typical implementations of the invention and are therefore not to be considered limiting of its scope. The invention will be described and explained with additional specificity and detail using the accompanying drawings in which.

DESCRIPTION OF VARIOUS EMBODIMENTS

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

The present disclosure relates to an optical assembly that includes one or more optical emitters (sometimes also generally referred to as electro-optic transducers, lasers, light emitters and other similar terminology). The optical assembly may include a laser driver, one or more lasers, and control circuitry. The physical and electrical interconnect between these various elements is implemented in a manner to provide an optical-electrical (O/E) bandwidth that accommodates a desired modulation bandwidth, and that is suited for high power and high frequency applications. In particular, disclosed embodiments minimize electrical parasitic inductance and capacitance or overall parasitic impedances in the optical assembly In disclosed embodiments, an optoelectronic assembly includes one or more optical emitters, that are configured to emit an optical signal in response to a laser drive current that is supplied to the optical emitter. One specific example of an optical emitter used in disclosed embodiments is a Vertical Cavity Surface Emitting Laser (VCSEL). Disposed on a substrate, such as a printed circuit board (PCB), is an integrated circuit (IC) having a laser driver circuit formed thereon. The laser driver circuit is configured to produce the electrical laser drive current for use by the one or more optical emitters. In disclosed embodiments, the integrated circuit may also include additional circuitry, such as a programmable controller, memory, and a pulse pattern generator, as well as other components as needed for a given application. As will be described in further detail, in at least one embodiment the one or more optical emitters, the laser driver integrated circuit and the printed circuit board are positioned and packaged in a stacked arrangement with respect to one another.

Figure 1:
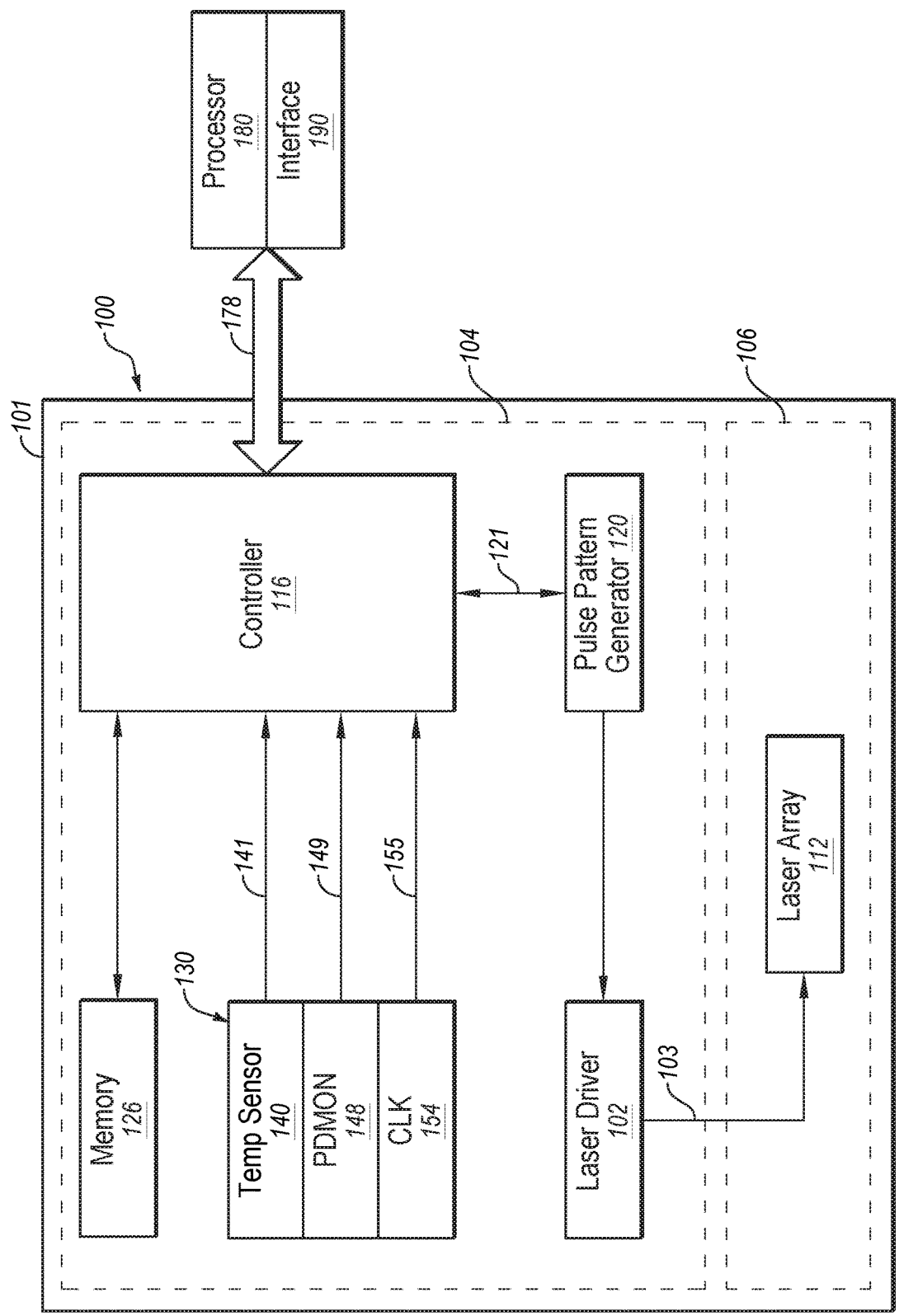
FIG. 1 is a schematic diagram of one implementation of an optoelectronic assembly.

Referring first to FIG. 1, illustrated is a schematic block diagram of one example embodiment of an optoelectronic assembly, denoted at 100. In one example, the various components of the optoelectronic assembly 100 are all physically positioned, either directly or indirectly, on a suitable multi-layer substrate, denoted here as 101. The substrate might be a printed circuit board (PCB), but other substrate configurations could also be used, such as a ceramic substrate, or a flexible multi-layer circuit substrate. One skilled in the art will appreciate that other substrate materials can also be used.

In one embodiment, the functional components of the optoelectronic assembly 100 are implemented separately, as is denoted by dashed lines 104 and 106. In one embodiment, those components within area denoted by 104 are all implemented within a single integrated circuit (IC), such as a Complementary metal-oxide-semiconductor (CMOS) IC. Similarly, the components denoted within area 106 might be implemented within a separate substrate material, such as a Gallium Arsenide (GaAs) wafer. As noted, both 104 and 106 are positioned, either directly or indirectly, on the PCB (or equivalent) 101, as will be discussed further below.

As is shown, the example optoelectronic assembly 100 includes one or more lasers, denoted here as a laser array 112, which in an example embodiment is configured as an array of VCSELs, example implementations of which will be described further below. While example embodiments are described with respect to optical emitters in the form of a VCSEL, it will be appreciated that other optical emitter types might also be used, such as such as distributed feedback lasers (DFB). Also, aspects of the present teaching may use light sources that include single emitters and/or multiple emitters. For example, light sources that use a single element VCSEL or a single edge-emitting laser device would be considered single emitters. Light sources that use multiple VCSEL elements or multiple edge-emitting laser sources arranged on one or more substrates (arrays) are considered multiple emitter sources.

The multi-element emitters may be configured in various array configurations, including one-dimensional and two-dimensional arrays. The descriptions below refer to various embodiments with single-emitter sources and/or multi-emitter laser sources. However, it will be apparent to those familiar with the art that the features of particular embodiments of the present teaching should not be considered limited to either single-emitter and/or multi-emitter laser sources, but rather should be more broadly construed to apply to both single-emitter and/or multi-emitter laser sources in a manner consistent with the present teachings. Also, the VCSEL array may be spaced symmetrically or asymmetrical for optimum optical or electrical characteristics. The VCSELs may be spaced according to a mathematical function for improved optical properties or electrical power transfer and speed. The VCSELs may be positioned for electrical phase relationships between the laser elements in the array for high fidelity of optical transmission or optimum power transfer to the lasers. In addition, the lasers in the array may be connected in many configurations, including series and parallel electrical connections and combinations of those. Also, it will be appreciated that electrical connections described may be to individual VCSELs, to common electrical contacts to a small number of VCSELs, or to electrical contacts to a large number of VCSELs in an array.

With continued reference to the embodiment of FIG. 1, the one or more VCSELs at 112 are operatively connected, as is denoted at line 103, to a laser driver circuit, denoted at 102. While example implementations will be described further below, the laser driver 102 functions to provide the one or more VCSELs (denoted at 112) with a drive current, as denoted at schematic line 103. The drive current supplied to the VCSEL (or similar optical emitter) causes the VCSEL to emit a corresponding optical signal, in a manner that is well known. It will be appreciated that there are many possible configurations of the laser driver, depending on the needs of a particular application, the types of optical emitter(s) used, etc. In one embodiment, the laser driver 102 is a pulsed laser driver, having a voltage controlled constant current source which is designed to deliver a repeatable set of current pulses at a set output level over user defined time intervals. As taught further below, the electrical connection (represented at 103) is provided so that the parasitic inductance of the connection is minimized. As noted above, parasitic inductance resists sudden changes in the switching current and degrades the rise and fall time, thereby limiting the switching frequency of the drive current, and the resulting optical signal pulses.

In disclosed embodiments, optoelectronic assembly 100 may also include additional components that provide additional functionality, particularly in connection with optical pulse patterns and/or pulse shapes that are generated by the VCSEL(s) 112. In the illustrated embodiment, this so-called pulse generation chain, in addition to the laser driver 102, may include a programmable controller, denoted at 116, memory, denoted at 126, and a pulse pattern generator, denoted at 120. In addition, an external system processor, denoted at 180 and a corresponding user interface 190, may be provided. The system processor is connected via a digital input/output connection, as denoted at 178, which can be provided by any suitable means, such as a serial interface in accordance with an I²C or serial peripheral interface (SPI) bus protocols.

In one embodiment, the controller 116 may be programmed to directly manage timing waveforms produced by the VCSEL(s) 112 by way of the laser driver 102. For example, drive current, edge rate (both rise and fall times of a pulse), pulse and/or burst duration and duty cycle may all be parameters that can be specified (for example, via the interface 190 at system processor 180), and which are then implemented via the controller 116. These control parameters may be memory mapped, and the controller 116 may set actual analog controls that correspond to the selected waveform parameters for purposes of controlling the drive current generated by the laser driver 102, resulting in a desired optical signal at the laser array 112. Thus, in disclosed embodiments, while the system processor 180 (via user selection at interface 190) may generate instruction(s) that specifies desired pulse pattern(s) and characteristics, the actual pattern generation and corresponding biasing of the lasers is all done locally at the optoelectronic assembly 100 on the IC 104 by virtue of patterns previously stored in memory 126. Generating the actual laser driver pulse patterns locally on the optoelectronic assembly 100 IC 104 greatly simplifies the required interface to the overall integrated optoelectronic assembly and increases operating efficiencies and speeds as there is no need to transmit waveforms from a location remote from the optoelectronic assembly itself.

The controller 116 itself may set operating parameters directly to the laser driver 102 by supplying a desired "PULSE" signal to the driver, including a repeating 50% duty cycle pulse train, as well as any arbitrary pulse sequence as previously defined. The limitation with respect to the controller 116 generating a pulse sequence to the laser driver 102 is the operating speed of the controller itself. For example, if the controller 116 is implemented by way of a 100 MHz microprocessor, then pulses must be 10 ns or slower.

Alternatively, or in addition to, an embodiment of the optoelectronic assembly 100 may include a pulse pattern generator, denoted at 120 which can be selectively enabled by the controller 116 when, for example, the pulse sequence characteristics cannot be generated by the controller (e.g., faster pulses), or simply to minimize use of the controller (lower power, etc.). In this embodiment the pulse pattern generator functions to directly control the laser driver 102 in accordance with a specific pulse pattern (PULSE), for example, but at higher frequencies (i.e., not limited by the constraints of a microprocessor system clock). This adds to the overall efficiency of the optoelectronic assembly 100 and avoids the need to utilize the controller itself. Further, providing wave pattern requirements directly to the pulse pattern generator 120, which can be implemented with analog components, increases the speeds at which the laser driver 102 can be controlled. For example, for ToF applications, a preferred waveform is a burst of 'N' ON pulses with a 50% duty cycle. The pulse pattern generator 120 may be configured to generate such patterns directly, including, under the direction of the controller, relevant characteristics of the pulse train, such as number of N ON pulses, length of the burst and/or adjustment to the duty cycle. Moreover, the pulse pattern generator 120 may utilize analog circuitry and an independent clock source and is thus capable of much higher pulse rates (e.g., and not limited in the same manner as the controller).

In yet another embodiment, the "PULSE" signal supplied to the laser driver 102 may originate at the system processor 180, or otherwise external to the optoelectronic assembly 100. Again, in one embodiment, the controller 116 may select this operating condition under program control.

In one example, controller 116 is provided in the form of an on-chip 32-bit microcontroller, such as an ARC (Argonaut RISC Core) embedded processor (such as ARC® EM4) processor or an ARM Cortex-M processor (such as an ARM Cortex-M0 or M0+). It will be appreciated by one of skill in the art that any one of a number of different processor implementations or designs could also be used, including Field-programmable gate arrays (FPGA). The controller 116 may have access to the persistent memory 126, which in some embodiments includes an Electrically Erasable and Programmable Read Only Memory ("EEPROM"). Persistent memory 126 may alternately or additionally be any other non-volatile memory source and may be implemented within the controller 116 itself, or as a separate memory component. Any group of components mentioned in optoelectronic assembly 100 may be packaged together in the same package or in different packages without restriction.

The behavior of the laser driver 102 and the VCSEL(s) 112 may vary dynamically due to a number of factors. For example, temperature changes, power fluctuations, and feedback conditions may each affect the performance of these components. Accordingly, the optoelectronic assembly 100 may also be implemented such that controller 116 may evaluate conditions and may adjust the operation of the optoelectronic assembly 100 in response to the evaluated conditions. The evaluated conditions may include environmental conditions such as temperature, and/or operating conditions such as emitted optical power and/or wavelength. The evaluated environment conditions and/or operating conditions allow the controller 116 to optimize the dynamically varying performance of the optoelectronic assembly 100.

For example, in one embodiment, additional circuitry, denoted at 130, may be included to allow the controller 116 to optimize operation. A temperature sensor 140 may be included to monitor the operating temperature of the optoelectronic assembly 100. For example, characterization of the laser bias, temperature, and output power of the device, and the subsequent tuning of laser bias and output power as a function of temperature to meet the required performance specifications with suitable margins. Often this process is performed during manufacturing. The performance parameters, such as the laser bias and optical power, obtained during the calibration process, can also be stored as a function of temperature as a reference in the system memory 126.

During operation of the optoelectronic assembly 100, the actual temperature can be monitored via one or more temperature sensors 140 and used in conjunction with the values stored in memory as a look-up table to set the laser bias. Alternatively, in combination with an optical power monitor, such as is denoted at photo-diode monitor 148, the actual values of output power, laser bias, and temperature during operation can be compared to the reference values to identify any significant change or degradation in the system, which can indicate potential reliability issues. Here, the photo-diode monitor 148 will be positioned such that some predetermined fraction of laser light is delivered to the monitor 148. In the example shown the photodiode monitor 148 is fabricated in the integrated circuit 104. One familiar with the art will appreciate that the photo-diode monitor may be placed elsewhere in the opto-electronic assembly, including integration into the laser array. In that case the circuit PDMON 148 on the IC 104 may only amplify or convert an input from the remotely placed photo-diode. In various implementations, an optoelectronic assembly 100 detecting such changes, via controller 116, as denoted at schematic line 141 (temperature) or schematic line 149 (optical power), could then communicate to the system processor 180 of detected problems, or may be used to instigate a shutdown mode to insure, for example, that the VCSEL(s) are not pushed beyond the rollover point and to avoid thermal runaway, or to implement requisite eye safety features whereby the driver 102/laser array 122 will be shut down if predefined optical power conditions are exceeded. In some embodiments, other safety features could be included. For example, a voltage across the VCSEL(s) could be monitored via appropriate circuitry, and if it exceeds a predetermined threshold the controller could 116 initiate a shutdown.

Figure 2:
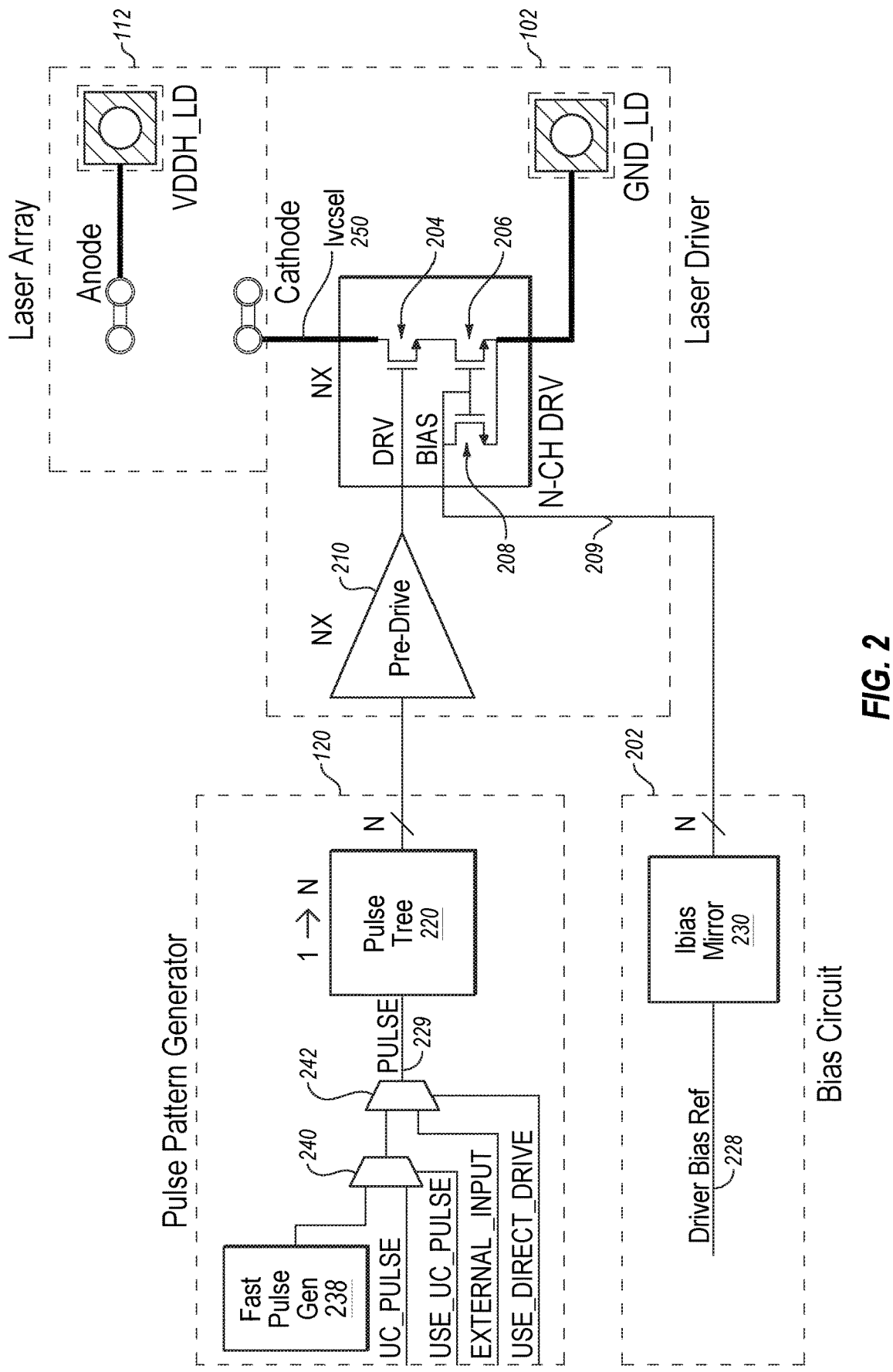
FIG. 2 is a schematic showing additional details of one example of a laser driver circuit from FIG. 1.

Reference is next made to FIG. 2, which illustrates one example of a laser driver circuit that might be used to implement the functionality of laser driver 102 and pulse pattern generator 120 of FIG. 1. In the example shown, implementations of a laser driver 102, a pattern pulse generator 120, and a current bias generation circuit 202 are shown, along with corresponding aspects of laser array 112 (e.g., the anode and cathode of an optical emitter, such as a VCSEL). The described embodiment is provided assuming the need to supply drive current to an array of optical emitters that are configured as VCSELs. It will be appreciated that the discussion applies to a single emitter as well. In the example, laser driver 102 may be configured as an array of N VCSEL driver sub-sections. In one implementation of the driver sub-section, there may be a stack of two n-channel FETs. One FET, denoted at 204, acts as a switch that is meant to be either fully off, or fully on, and having low Rds(on). The second FET, denoted at 206, has a controlled gate-source voltage (Vgs) so as to control the drain current, Id, of FET 206. The sum of all the currents Id from each sub-section is the Ivcsel current (250) to drive the VCSEL at the cathode (one of which is denoted in the FIG. 2). Alternatively, sub-sections of the driver circuit 102 could drive sub-sections of a VCSEL array. A third n-channel FET, denoted at 208, is diode connected to generate the desired Vgs based on an input bias current at 209. In the example embodiment, a pre-driver component, denoted at 210, is used to drive the gate of the switching FET 204. The pre-driver 210 can be implemented as a series of progressively larger CMOS buffers, or similar. The input of the pre-driver is implemented to present a relatively small capacitive load to the pulse tree component, denoted at 220, of the pulse pattern generator 120.

As previously discussed, in one embodiment the "pulses" to activate the laser driver 102 may be provided directly by the controller 116. For example, as is illustrated in FIG. 2, in one example the controller 116 generates a pulse pattern indicated at signal "UC_PULSE," for example as may be stored in memory 126. The controller 116 may select UC_PULSE as the source via, for example, activation of a control signal "USE_UC_PULSE" that causes a multiplexor (or similar) denoted at 240 to select UC_PULSE as the source. The signal UC_PULSE would then be passed to the PULSE input of the pulse tree 220 (described further below).

In another embodiment, as described above, the PULSE signal may be generated by the pulse pattern generator 120 itself. Here, the PULSE signal may originate at a fast pulse generator, denoted at 238, which may produce a pulse signal at higher frequencies that what the controller can do, due to, for example, internal speed limitations of the controller 116. Using the fast pulse generator 238 as the source of the PULSE signal would involve manipulation of the multiplexor 240 via the USE_UC_PULSE control signal.

In yet another embodiment, the source of the PULSE signal may originate external to the optoelectronic circuit 100, for example at processor 180. This is denoted at EXTERNAL_INPUT in FIG. 2, and its selection may be provided via control signal USE_DIRECT_DRIVE at multiplexor 242, for example.

In connection with the foregoing, which PULSE source is activated may depend on, for example, the pulse pattern that is required (e.g. a faster pulse requirement may require activation of the pulse pattern generator). In the example embodiment, the output section of the pulse pattern generator 120 is a pulse tree 220 that implements the one-to-many distribution of the centrally generated "driver on" PULSE to the N driver sub-sections. In a preferred embodiment, the controller 166 will programmably select the desired laser drive current (denoted at Ivcsel 250 in FIG. 2). A bias circuit, denoted at 202, may contain appropriate digital-to-analog (DAC) circuitry that converts a digital value (not shown) from the controller 116 to an appropriately scaled reference current, denoted at 228, for use by the laser driver circuit 102 via 209 (and to produce the desired output drive current at Ivcsel at 250 in FIG. 2). In the illustrated embodiment, the output of the bias block 202 has a 1-to-N current mirror to deliver a separate bias current replica 209 to each driver subsection N. The one-to-many distribution of bias currents is insensitive to differences in ground voltage at the many driver sub-sections.

Referring again to FIG. 1, in at least one embodiment, the laser array 112 is comprised of one or more VCSELs formed on a substrate 106 that is separate from integrated circuit 104. In one embodiment, the VCSELs in the array 112 are Gallium Arsenide (GaAs) based wafers, although other materials may be used such as Indium Phosphide (InP), Gallium Nitride (GaN) or Silicon (Si). The VCSEL arrays can be formed from a plurality of individual VCSEL chips, or sub-arrays of VCSEL chips, depending on the needs of a particular application. In a disclosed embodiment, the one or more VCSELs are formed as "back-side" emitting (sometimes referred to as a bottom emitting) VCSELs. This is in contrast to a more conventional "top-side" emitting VCSEL in which an electrical connection is required at the top of the die via the aforementioned wire bond(s). By using a backside emitting configuration, VCSELs can be flip-chip mounted onto the integrated circuit that includes the laser driver circuitry, as will be described further.

A back-emitting VCSEL configuration provides several advantages. It requires no wire bonds for electrical connections to the VCSEL array. Instead, as is shown in disclosed embodiments, the VCSEL die is flip-chip bonded to a sub-mount, such as the integrated circuit in the illustrated embodiment. In this way, all the required electrical connections are defined. Further, elimination of wire bonds allows back-emitting VCSEL die to be tiled close to one another to form large illumination modules that produce enough power, for example, for long-range sensing applications. In addition, eliminating wire bonds reduces the parasitic impedance of the package (as well as other drawbacks of the wire bond), and in turn speeds rise and fall times. As noted, this is particularly advantageous for improving the performance in pulsed depth-sensing applications.

Another advantage of back-side emission is that it allows micro-lenses to be monolithically etched directly into the emitting surface, if desired. This allows for beam shaping, such as reducing the divergence of each VCSEL emitter, or diffusing light output. Also, lenses can be offset from the emitter aperture to steer the beam off-axis. This enables fully solid-state beam steering, by combining beam pointing with individual addressability of zones of the VCSEL apertures. As such, the overall system cost for applications such as 3D sensing can be reduced by eliminating optical elements or beam steering components.

Figure 3:
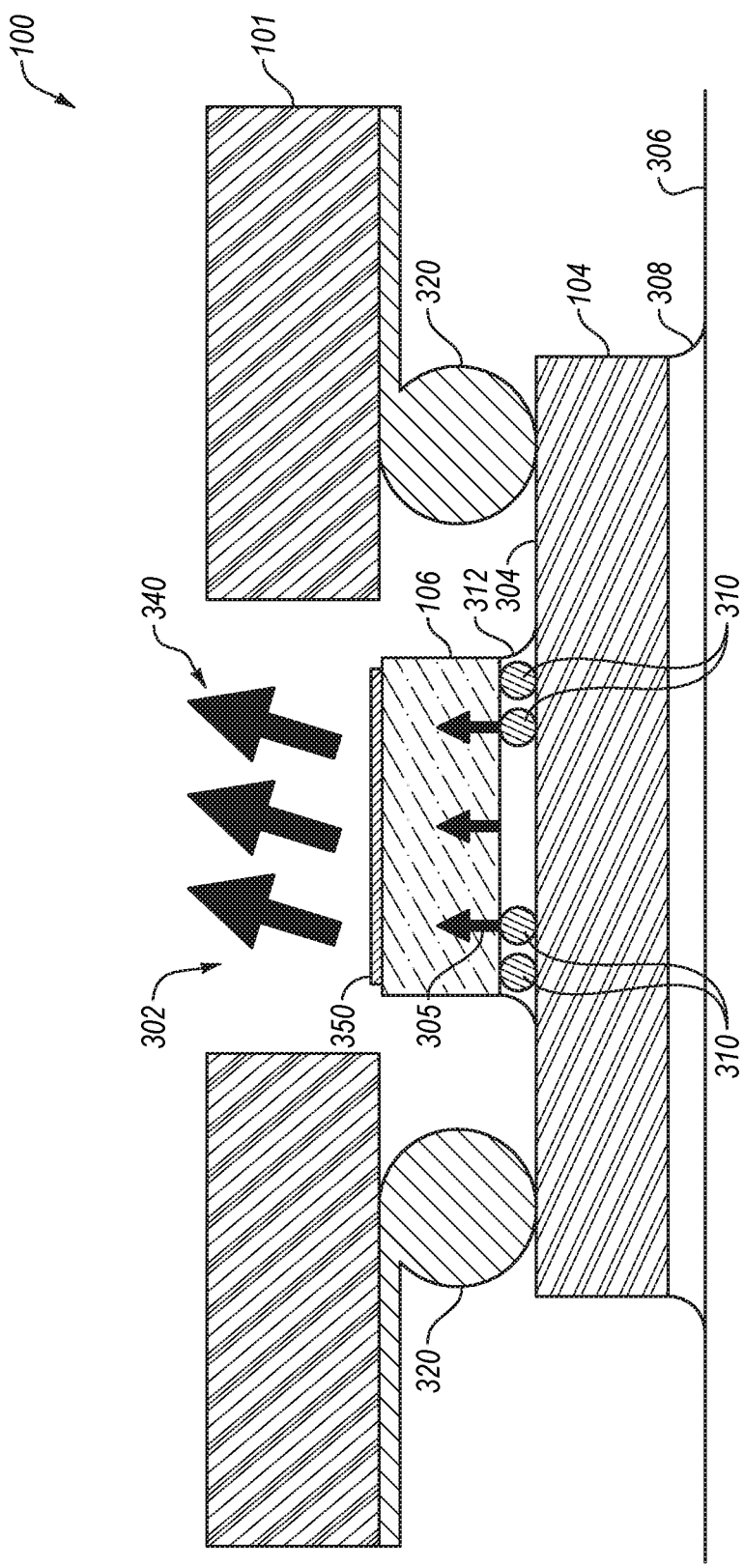
FIG. 3 cross-sectional view of one example of an optoelectronic assembly.

Referring next to FIG. 3, one embodiment of a physical arrangement of a single VCSEL in the optoelectronic assembly 100 is shown in schematic form. For purposes of convenience, the description is in reference to a single VCSEL. It will be appreciated that the teachings would apply equally for an array of VCSELs formed on a substrate or wafer. In the embodiment of FIG. 3, the relative placement of each substrate is shown: the substrate 101, such as a PCB; the integrated circuit substrate 104, such as the CMOS IC; and the VCSEL substrate 106, such as GaAs, each as described above. As can be seen, the various substrate layers are arranged in a "stacked" configuration so as to define a three-dimensional arrangement for the optoelectronic assembly 100. As shown, VCSEL 106 is configured as a backside emitting VCSEL, whereby light is emitted from the bottom of the device, as is denoted schematically at arrows 305, and through the transparent substrate 106 (here GaAs).

In one embodiment, the VCSEL is flip-chip mounted directly to the surface 304 of the integrated circuit substrate 104 in the manner shown. In one example, the VCSEL is operably connected (as is schematically denoted at 103 in FIG. 1), both mechanically and electrically, to the laser driver circuitry 102 by way of one or more conductive pillars, denoted at 310. In one embodiment, the pillars are formed from copper (Cu), although other materials could also be used. The orientation of the backside emitting VCSEL with respect to the laser driver 102 formed on the integrated circuit 104, and the use of the conductive pillars, allows for a greatly reduced conductive path for the drive current supplied to the VCSEL. By eliminating wire bonds, the approach greatly reduces the parasitic inductance presented by the electrical path, thereby allowing for higher frequency signal rates, including much faster pulse rise and fall times as compared to traditional implementations described above.

In an example embodiment, a filler material, denoted at 312, can also be provided at points between the VCSEL 106 and the surface 304 of integrated circuit 104. The filler 312 can provide additional mechanical support. Also, a filler material can be selected that acts as a heatsink to the VCSEL, thereby providing additional thermal dissipation with respect to the heat generated at the backside of the VCSEL, the junction where most thermal energy is generated. The integrated circuit substrate 104 may also be mounted to a heat sink, denoted at 306. This too may be accomplished with a suitable underfill material, denoted at 308.

In the example embodiment of FIG. 3, the integrated circuit substrate 104 is mechanically mounted to the PCB 101 by way of one or more solder "balls" denoted at 320 via well known surface mount techniques. In addition, an aperture 302 may be formed in the PCB to allow the light emitted from the VCSEL (denoted at 340) to pass. Alternatively, the PCB can be formed with glass (or other transmissive material). Optionally, micro-lenses can be monolithically etched directly into the emitting surface, such as an integrated diffuser, such as is denoted at 350. Also, lenses can be offset from the emitter aperture to steer the beam off-axis, or to provide other optical configurations.

Figure 4:
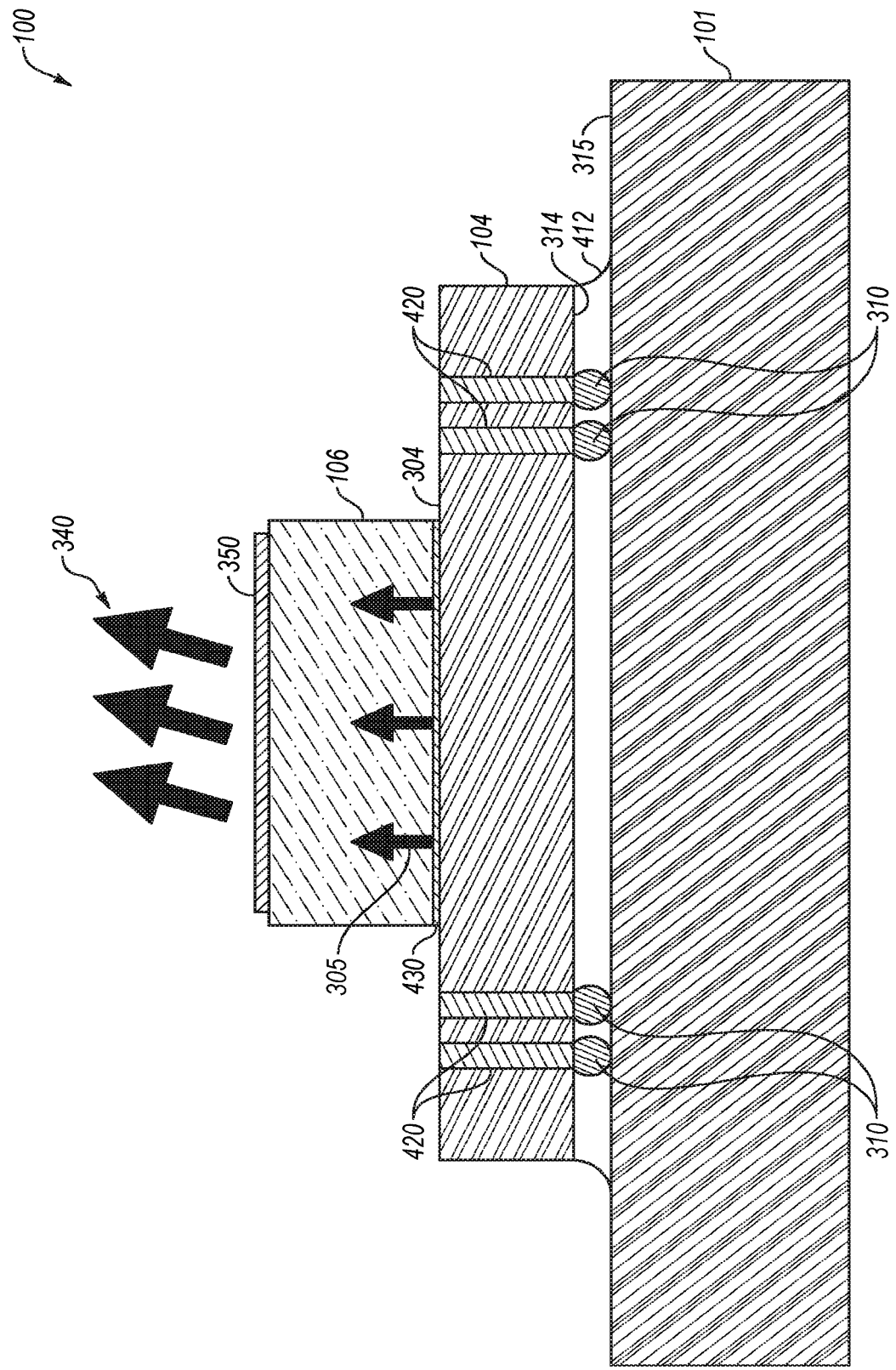
FIG. 4 is a cross-sectional view of another example embodiment of an optoelectronic assembly.

Reference is next made to FIG. 4, which illustrates yet another embodiment of an optoelectronic assembly 100. As with the embodiment of FIG. 3, the relative placement of each substrate (106, 104 and 101) is shown as again being arranged in a stacked arrangement. However, the relative placement is changed from that of FIG. 3. In the example of FIG. 4, backside emitting VCSEL 106 is mounted directly to the surface 304 of integrated circuit substrate 104. Further, in this embodiment, the operable interconnection (denoted at 103 in FIG. 1) between the VCSEL 106 and the laser driver 102 is provided by way of a Direct Bond Interconnect (DBI®) layer, denoted at 430 in FIG. 4, instead of the conductive pillars used in the example embodiment of FIG. 3. The DBI layer 430 provides both a mechanical and electrical connection between the laser driver integrated circuit 104 and VCSEL 106 and eliminates the need for underfill layer(s) while still provided good electrical and thermal performance. Moreover, DBI layer 430 may provide for even lower parasitic inductance in the electrical connection, further enhancing the speeds at which the laser driver 102 can drive the VCSEL 106. Other thermocompression bonding layers or substitute conductive bonding layers may also be used.

As is further shown in the example embodiment of FIG. 4, the integrated circuit substrate 104 is operably connected to the printed circuit board substrate 101 by way of one or more through-silicon vias (TSV), denoted at 420, formed through the substrate 104. In this embodiment conductive pillars, such as copper, denoted at 310 may be used to complete the electrical connection between a given via 420 and the printed circuit board substrate 101, to form a mechanical bond. As with the embodiment of FIG. 3, a filler material, denoted at 412, can also be provided at points between the bottom surface 314 of integrated circuit 104 and the corresponding surface 315 of the printed circuit board substrate 101.

Figure 5:
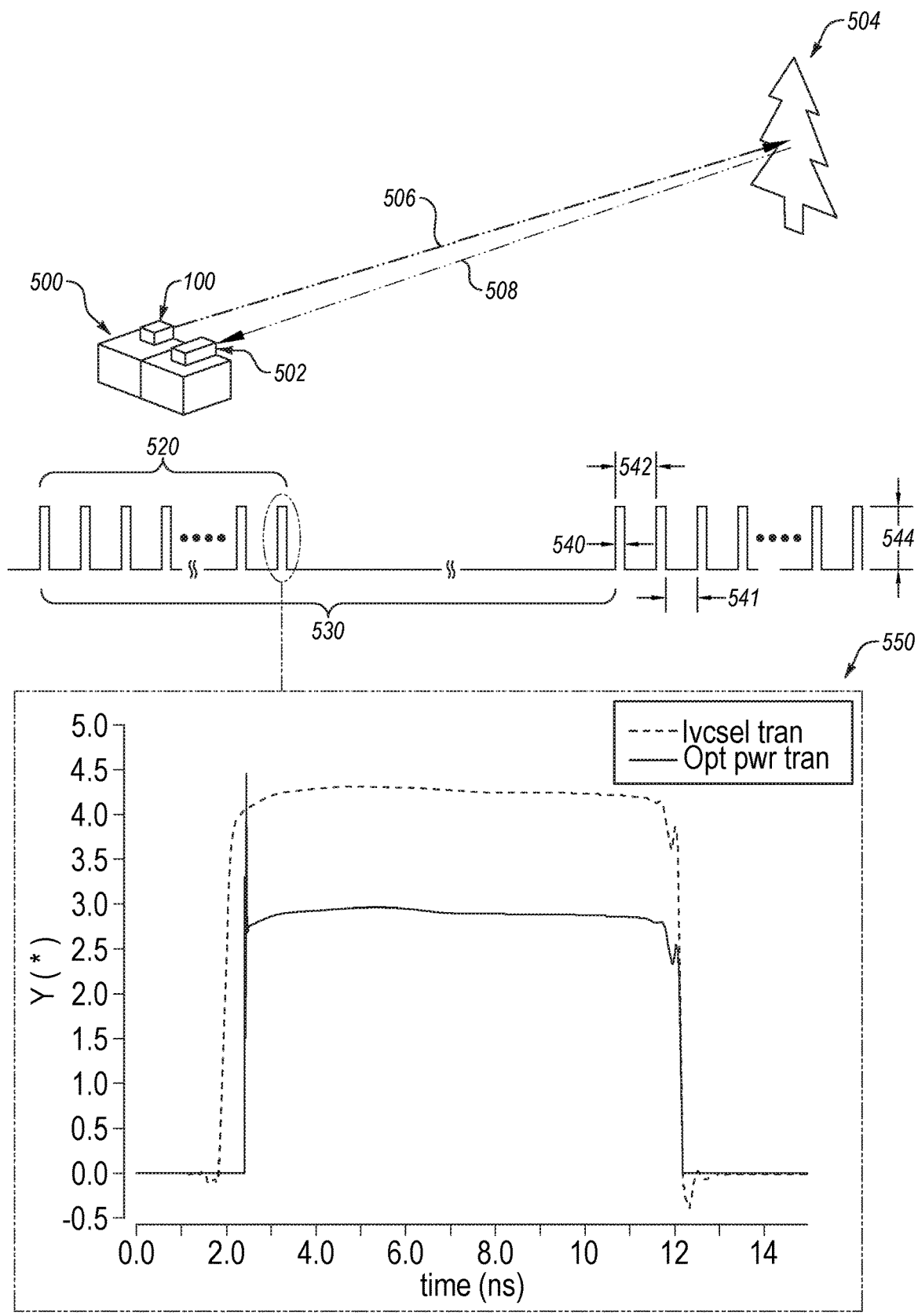
FIG. 5 illustrates one example of an operating environment in which the optoelectronic assembly may find application.

Reference is next made to FIG. 5, which illustrates one example of an operational scenario for the optoelectronic assembly 100. An optoelectronic assembly 100 is shown as being incorporated in a device 500 that includes the functionality to determine, for instance, the distance of an object, denoted at 504. The optoelectronic assembly 100 here acts as a pulsed optical source and illuminates the object 504 with an encoded (pulsed) beam, represented at 506. The arrival time of the reflected pulse, represented at 508, is measured with a detector or a camera system, denoted at 502. In typical ToF applications, the encoding scheme tends to employ a burst pattern, e.g., as indicated at 520, that is repeated at a burst period, denoted at 530. Additional signal characteristics include pulse width high (or PWH) 540, pulse width low (or PWL) 541, and pulse period 542 (otherwise referred to as duty cycle). A burst pattern such as that shown in FIG. 5, may contain additional pulse patterns that allow the system to disambiguate multiple reflections, or other spurious returns. Further details of a given pulse are shown in the graph at 550, which illustrates both the drive current supplied to the VCSEL (denoted at Ivcsel), as well as the corresponding optical pulse (denoted as Opt pwr tran). In particular, the rise time of the signal (i.e., the time taken for the optical signal to cross a specified lower optical power threshold followed by a specified upper optical power threshold), and fall time of the signal (i.e., the time taken for the optical signal pulse to decrease, or fall, from a the upper optical power threshold to the lower optical power threshold). In preferred embodiments and as described above, one or more of these timing profile characteristics can be specified by a user, and the programmable optoelectronic assembly 100 generates a corresponding pulse pattern. For example, programmable wave form characteristics that may be expressed by a user as follows:

$t_D$ specifies the duration of a burst pattern 520, either in terms of time or number of pulses;

Ivcselmag specifies the magnitude of the laser driver output/VCSEL input, in amps;

$t_{rise}$ specifies the rise time in nano seconds;

$t_{fall}$ specifies the fall time in nano seconds;

$t_{bp}$ specifies the burst period duration in nano seconds;

PWH specifies duration of the pulse while high 540 in nano seconds;

PWL specifies duration of the pulse while low 541 in nano seconds; and $DC_d$ is the duty cycle of the pulse pattern, expressed as a percentage.

It will be appreciated that these characteristics of a desired wave pattern are not limiting and are merely representative. One or more characteristics could be specified by a user depending on the application, and one of skill in the art will appreciate that other characteristics of a wave pattern might also be used and not shown here. Moreover, certain of the above characteristics may be redundant to others. The foregoing is meant to illustrate the flexibility of an exemplary optoelectronic assembly 100 in terms of the ability to program wave pattern characteristics.

Figure 6:
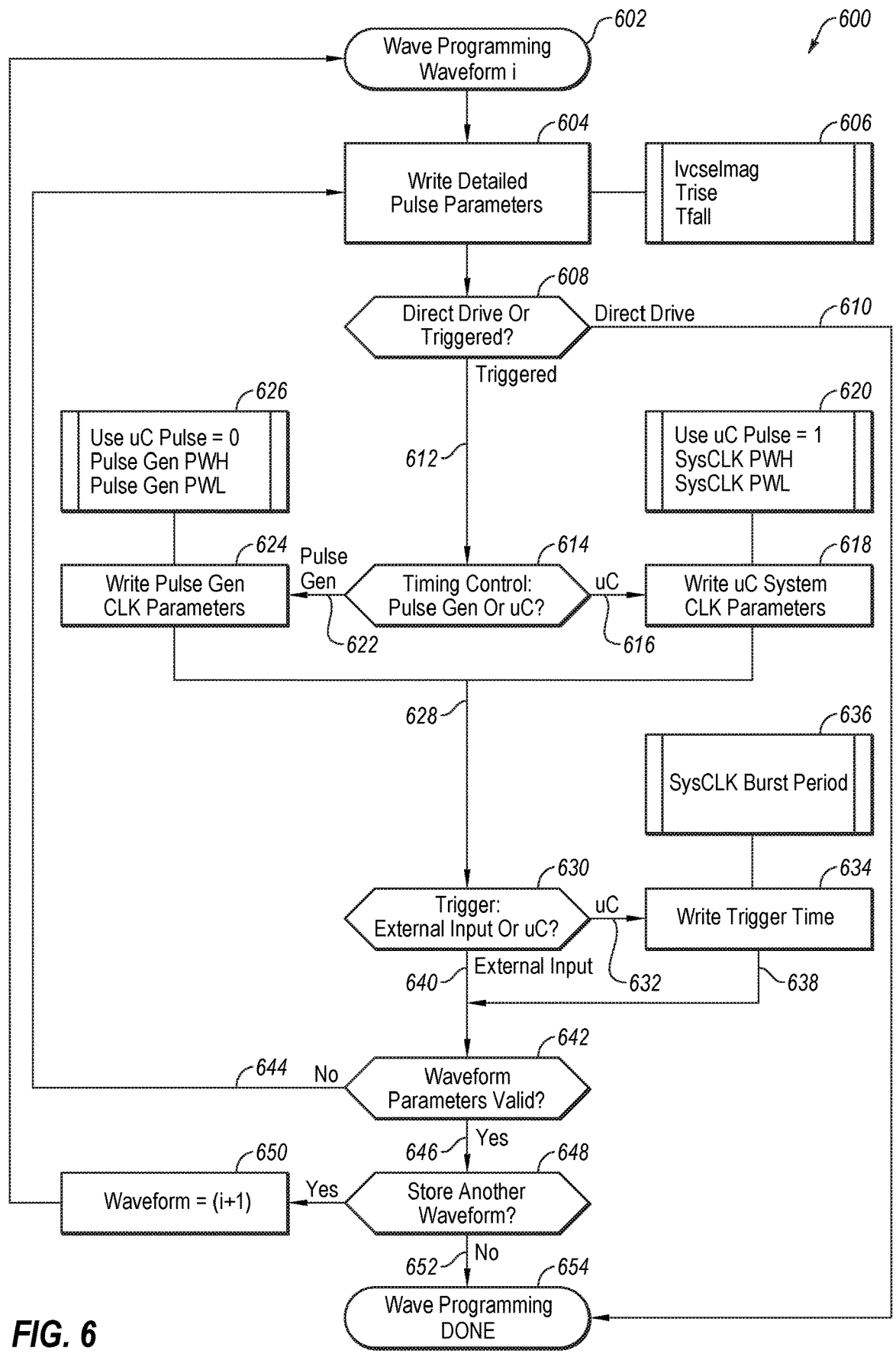
FIG. 6 is a flowchart of an example method of operating an exemplary optoelectronic assembly.

Referring now to FIG. 6, one example of a methodology, denoted at 600, for programming a wave pattern in the optoelectronic assembly is shown. Once created, a given wave pattern can be requested, and then automatically generated at the optoelectronic assembly 100 independent of any external processor or circuit. In describing the example steps of FIG. 6, reference is also made to FIGS. 1 and 2 as well as FIGS. 7A-7D, which shows example wave patterns pertaining to example operations.

Beginning at initialization step 602, a process for creating a desired optical wave pattern for emission by the one or more optical emitters, such as a VCSEL array, begins. At step 604, relevant wave characteristics are provided, for example via user interface 190 and via processor 180. In this particular example, $I_{VCSELmag}$ (a desired magnitude of the laser driver output/VCSEL input $I_{VCSEL}$, in amps); $t_{rise}$ (a desired rise time in nano seconds); and $t_{fall}$ (a desired fall time in nano seconds) are identified and stored in appropriate memory location as denoted at 606. One example is shown in the waveform shown at FIG. 7A. It will be appreciated that any other variation or combination of wave characteristics could also be provided, as previously discussed.

At step 608, it is determined whether an input PULSE signal to the laser driver 102 will be generated external ("Direct Drive") to the optoelectronic assembly 100 (e.g., via processor 180) as described previously in connection with the example embodiment of FIG. 2, or whether PULSE will be generated at the optoelectronic assembly 100. If the PULSE is to be generated externally (Direct Drive), the controller 116 will activate the appropriate control signals relative to the pulse pattern generator 120 as previously described above, and processing will continue as indicated at 610, and proceed to completion of wave programming, as denoted at 654. An example waveform is shown in 7B.

If at step 608 it is determined that the desired PULSE will be generated at the optoelectronic assembly 100 ("Triggered"), then processing continues as indicated at 612. At step 614, it is determined whether PULSE is generated at the pulse pattern generator 120 or at the controller 116. For example, the wave form characteristics indicated at 604 may dictate whether the pulse generator 120, or the controller 116, acts as a source of the PULSE signal. If the controller 116 is to be the source, processing continues at 616, and the appropriate control signal (uC Pulse=1) is generated so as to make the appropriate PULSE source activation at the multiplexor 240 in FIG. 2. Also, other waveform characteristics may be specified (or obtained) to (from) memory, such as PWH (duration of the pulse while high 540 in nano seconds) and PWL (duration of the pulse while low 541 in nano seconds), using the SysCLK (e.g., as denoted at 154 in FIG. 1). If at 614 it is determined that the pulse pattern generator 120 is to provide PULSE, then processing continues at 622, and similar parameters with respect to the pulse pattern generator are defined, using the pulse pattern generator clock (e.g., as indicated at the fast pulse gen 238 in FIG. 2 as discussed above).

Figure 7A:
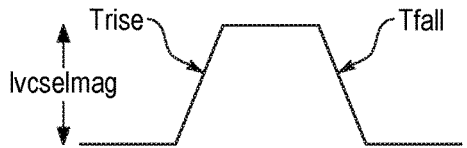
FIGS. 7A-7D are example waveforms according to the embodiments described herein.
Figure 7B:
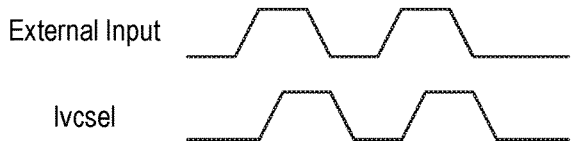
Figure 7C:
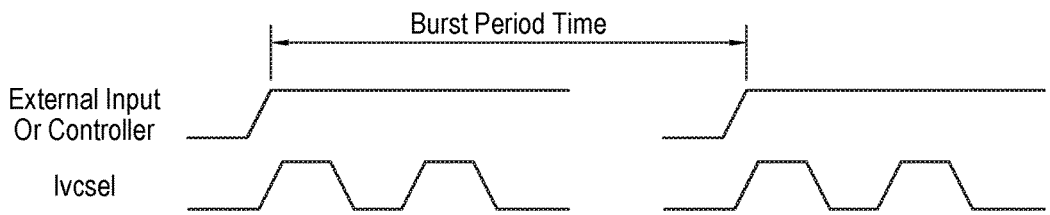
Figure 7D:
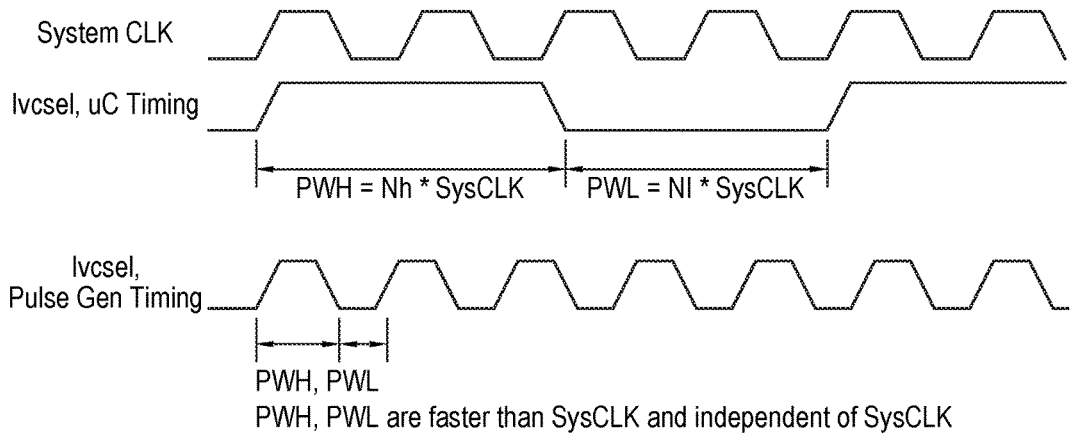

Processing then continues at step 630, where the "trigger" source is determined, either, for example, via the controller 116 or via external input. If via the controller, processing continues a 632, where, for example, additional relevant characteristics are specified (or obtained) to (from) memory 126. For example, the required burst period is identified, $t_{bp}$ which is the burst period duration in nano seconds. This will dictate the "trigger" time, as indicated in FIG. 7C. Alternative, the trigger for designating the appropriate burst period of a desired waveform can be provided externally.

Processing continues at step 642, where it is determined whether the programmed/requested wave form is valid. For example, it may be determined whether the requested parameters are valid for a given laser emitter or fall outside of acceptable operating conditions for the optoelectronic assembly. If an improper parameter is requested, an error message may be generated to the processor 180/interface 190, and processing will return to 604 for possible correction. If the wave form parameter is deemed valid, processing continues at 648, where it is determined whether additional waveforms are required. If so, the process begins again at 650 to 602. Otherwise, processing concludes at 654.

Once viable waveforms are stored in memory 126, the optoelectronic assembly 100 can independently generate wave forms having desired characteristics, merely by specifying the desired wave form parameters, such as those discussed above, and the appropriate wave form will be retrieved from memory. No other external interaction is required.

In summary, disclosed embodiments provide a optoelectronic assembly that provides a unique, integrated and high performance programmable laser driver and optical emitter configuration. In disclosed examples, a VCSEL array is integrated with a programmable laser driver so as to accommodate exceedingly fast optical waveforms, particularly suitable for a variety of 3D sensing applications, and others. In particular, the integration and connection of the programmable laser driver with the VCSEL array is accomplished in a manner that is devoid of bond wires and the like, so as to minimize the parasitic inductance, and related constraints. This allows the programmable laser driver to operate the VCSELs at much higher speeds, and to provide optical wave forms having ideal characteristics for certain applications, such as 3D sensing, such as fast rise and fall times. Moreover, the integrated assembly, and elimination of wire bonds, allows for a much more compact form factor, which is ideal for certain applications. In addition, the programmable nature of the laser driver provides unique benefits. Such benefits may include, for example, the ability to provide a user interface to the laser driver so as to allow a user to specify wave form characteristics; the ability to program and store multiple waveforms directly on memory associated with the laser driver, that can then be selected by a user in accordance with desired wave form attributes; the ability to select from one or more pulse sources for the laser driver, including an integrated controller and an integrated pulse generator.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.).

Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic assembly comprising:
   a printed circuit board (PCB) defining an aperture;
   a common integrated circuit substrate operably mounted directly to the PCB across the aperture;
   an emitter substrate operably mounted directly to the integrated circuit substrate adjacent the aperture;
   one or more optical emitters each configured as a backside emitting optical emitter to emit an optical signal through the aperture in response to a laser drive current, the one or more optical emitters each disposed on the emitter substrate and flip-chip mounted to a surface of the integrated circuit substrate; and
   a driver circuit configured to generate the laser drive current for use by the one or more optical emitters so as to produce the one or more optical signals having one or more predetermined wave form characteristics, the wave form characteristics stored in a memory component, the driver circuit and the memory component disposed on the common integrated circuit substrate;
   wherein the emitter substrate, the integrated circuitry substrate, and the PCB are positioned in a stacked arrangement with respect to one another.

2. The optoelectronic assembly of claim 1, wherein the one or more optical emitters comprise an array of vertical-cavity surface-emitting lasers (VCSEL).

3. The optoelectronic assembly of claim 2, wherein the emitter substrate for the array of VCSELs is formed from a gallium arsenide (GaAs) wafer.

4. The optoelectronic assembly of claim 3, wherein the VCSELs are each configured as a backside emitting VCSEL that are each flip-chip mounted to the surface of integrated circuit substrate in a manner so as to effect an operable electrical connection between the driver circuit and the VCSEL.

5. The optoelectronic assembly of claim 3, wherein the operable electrical connection between the driver circuit and the VCSEL is at least partially provided with one or more conductive pillars disposed between the integrated circuit substrate and the emitter substrate.

6. The optoelectronic assembly of claim 5, wherein the one or more conductive pillars comprise copper (Cu).

7. The optoelectronic assembly of claim 1, wherein the integrated circuit substrate is electrically and mechanically mounted to the PCB with one or more solder balls.

8. The optoelectronic assembly of claim 1, wherein the common integrated circuit substrate further comprises an integrated programmable controller, the programmable controller configured to control the operation of the laser driver circuit to generate the laser drive current in accordance with the one or more wave form characteristics stored in the memory component.

9. The optoelectronic assembly of claim 8, wherein the wave form characteristics includes at least one of the following: a burst pattern duration; a magnitude of the laser driver current; a rise time of a wave form pulse; a fall time of a wave form pulse; a burst period duration; a duration of a wave form pulse while high; a duration of a wave form pulse while low; and a duty cycle of a wave form pulse pattern.

10. The optoelectronic assembly of claim 1, further comprising a heat sink having the integrated circuit substrate operably mounted directly thereto.

11. The optoelectronic assembly of claim 10, further comprising a filler material disposed between the integrated circuit substrate and the heat sink.

12. The optoelectronic assembly of claim 1, further comprising a filler material disposed between the optical emitter and the surface of the common integrated circuit substrate and being configured to provide mechanical support and to dissipate heat from the optical emitter.

13. The optoelectronic assembly of claim 1, wherein the aperture comprises a transmissive material of the PCB.

14. The optoelectronic assembly of claim 1, further comprising a micro-lens or a diffuser monolithically etched directly into an emitting surface of the optical emitter.

15. The optoelectronic assembly of claim 1, further comprising one or more conductive pillars disposed between the common integrated circuit substrate and the emitter substrate, the one or more conductive pillars configured to provide mechanical and electrical connection between the driver circuit and the one or more optical emitters.

16. The optoelectronic assembly of claim 15, wherein the one or more conductive pillars are configured to reduce a conductive path for the drive current suppled to the one or more optical emitters.

17. The optoelectronic assembly of claim 1, further comprising a lens offset from the aperture and configured to steer the optical signal off-axis.

* * * * *